(12) United States Patent
Chae

(10) Patent No.: US 12,033,997 B2
(45) Date of Patent: Jul. 9, 2024

(54) STANDARD CELL HAVING POWER RAILS DISPOSED IN CENTRAL REGION THEREOF AND STANDARD CELL BLOCK

(71) Applicant: Samsung Electronics Co., Ltd., Suwon-si (KR)

(72) Inventor: Jungkyu Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 657 days.

(21) Appl. No.: 17/035,619

(22) Filed: Sep. 28, 2020

(65) Prior Publication Data

US 2021/0343696 A1    Nov. 4, 2021

(30) Foreign Application Priority Data

Apr. 29, 2020   (KR) .................. 10-2020-0052046

(51) Int. Cl.
*H01L 27/02* (2006.01)
*H01L 23/522* (2006.01)
*H01L 23/528* (2006.01)

(52) U.S. Cl.
CPC ...... *H01L 27/0207* (2013.01); *H01L 23/5226* (2013.01); *H01L 23/5286* (2013.01)

(58) Field of Classification Search
CPC ........... H01L 23/5286; H01L 27/11807; H01L 2027/11881
See application file for complete search history.

(56) References Cited

U.S. PATENT DOCUMENTS

| | | | |
|---|---|---|---|
| 8,357,955 B2 | 1/2013 | Tanaka | |
| 8,698,205 B2 | 4/2014 | Tzeng et al. | |
| 8,742,464 B2 | 6/2014 | Sherlekar et al. | |
| 8,987,786 B1 | 3/2015 | Tan et al. | |
| 9,558,312 B2 | 1/2017 | Lu et al. | |
| 10,275,559 B2 | 4/2019 | Wang et al. | |
| 11,018,157 B2* | 5/2021 | Chen | H01L 23/5226 |
| 2009/0315079 A1* | 12/2009 | Tien | H01L 27/0207 257/369 |
| 2019/0355749 A1 | 11/2019 | Do et al. | |

* cited by examiner

*Primary Examiner* — Phat X Cao
*Assistant Examiner* — Diana C Vieira
(74) *Attorney, Agent, or Firm* — Fish & Richardson P.C.

(57) ABSTRACT

A standard cell comprises a first active region and a first power rail, the first active region and the first power rail disposed in a first MOS region; a second active region and a second power rail, the second active region and the second power rail disposed in a second MOS region; and a gate electrode extending to cross the first and second active regions and the first and second power rails in a first direction, wherein the first power rail is disposed closer to a boundary between the first MOS region and the second MOS region than to a first side of the first MOS region opposite the boundary, and wherein the second power rail is disposed closer to the boundary between the first MOS region and the second MOS region than to a first side of the second MOS region opposite the boundary.

7 Claims, 17 Drawing Sheets

STANDARD CELL HAVING POWER RAILS DISPOSED IN CENTRAL REGION THEREOF AND STANDARD CELL BLOCK

CROSS-REFERENCE TO THE RELATED APPLICATION

This application claims priority under 35 U.S.C. § 119 to Korean Patent Application No. 10-2020-0052046, filed on Apr. 29, 2020, in the Korean Intellectual Property Office, the disclosure of which is incorporated herein by reference in its entirety.

BACKGROUND

1. Field

The disclosure relates to a standard cell having power rails disposed in a central region thereof and a standard cell block having the standard cells.

2. Description of the Related Art

In general, when viewed in a plan view, standard cells may have power rails disposed on a top side and a bottom side thereof. Thus, the height of each standard cell and the widths of active regions in each standard cell may have fixed values. These limitations make it difficult to form active regions having various widths in a standard cell having a fixed height.

SUMMARY

Exemplary embodiments of the disclosure provide a standard cell having power rails disposed in a central region thereof.

Exemplary embodiments of the disclosure provide a standard cell having active regions having various widths.

Exemplary embodiments of the disclosure provide a standard cell having various heights.

Exemplary embodiments of the disclosure provide a standard cell that increases design freedom.

The objects to be accomplished by the embodiments are not limited to the above-mentioned objects, and other objects not mentioned herein will be clearly understood by those skilled in the art from the following description.

A standard cell in accordance with an exemplary embodiment of the disclosure may include: a first active region and a first power rail, the first active region and the first power rail disposed in a first MOS region; a second active region and a second power rail, the second active region and the second power rail disposed in a second MOS region; and a gate electrode extending to cross the first and second active regions and the first and second power rails in a first direction. The first power rail may be disposed closer to a boundary between the first MOS region and the second MOS region than to a first side of the first MOS region opposite the boundary. The second power rail may be disposed closer to the boundary between the first MOS region and the second MOS region than to a first side of the second MOS region opposite the boundary.

A standard cell block in accordance with an exemplary embodiment of the disclosure may include a plurality of standard cells disposed in a matrix form. Each of the plurality of standard cells may include: a first active region and a first power rail, the first active region and the first power rail disposed in a first MOS region and extending in a first direction; and a second active region and a second power rail, the second active region and the second power rail disposed in a second MOS region and extending in the first direction. The first power rail may be disposed closer to a boundary between the first MOS region and the second MOS region than to a first side of the first MOS region. The second power rail may be disposed closer to the boundary between the first MOS region and the second MOS region than to a first side of the second MOS region. Each power rail of the first power rails and each power rail of the second power rails of the plurality of standard cells may extend lengthwise in the first direction and may have a uniform width in a second direction perpendicular to the first direction.

A standard cell in accordance with an exemplary embodiment of the disclosure may include: a first metal-oxide-semiconductor (MOS) region including a first well region; a second MOS region disposed adjacent to the first MOS region and including a second well region; a first active region, a first power rail, and a first signal line, the first active region, the first power rail, and the first signal line disposed in the first MOS region and extending in a first direction; a second active region, a second power rail, and a second signal line, the second active region, the second power rail, and the second signal line disposed in the second MOS region and extending lengthwise in the first direction; a gate electrode extending to cross the first active region, the first power rail, the second active region, and the second power rail in a second direction, the gate electrode forming a first drain region and a first source region of the first active region and a second drain region and a second source region of the second active region; a first contact pad vertically overlapping the first source region; a second contact pad vertically overlapping the second source region; a common contact pad vertically overlapping the first drain region and vertically overlapping the second drain region; a first power via plug electrically connecting the first contact pad to the first power rail; a second power via plug electrically connecting the second contact pad to the second power rail; a first signal via plug electrically connecting the gate electrode to the first signal line; and a second signal via plug electrically connecting the common contact pad to the second signal line. The first power rail may be disposed closer to the boundary between the first MOS region and the second MOS region than the first signal line. The second power rail may be disposed closer to the boundary between the first MOS region and the second MOS region than the second signal line.

DETAILED DESCRIPTION OF EXEMPLARY EMBODIMENTS

The term "standard cell" refers to a unit cell or a logic cell having a size standardized in a first direction (a row direction) and a second direction (a column direction), each direction being viewed from a plan view. In this specification, the "height of the standard cell" may be the length of the standard cell in the second direction, and the "width of the active region" may be the length of the active region in the standard cell in the second direction.

In the related art, the height of a standard cell may be defined by the distance between a VDD power rail located on a top side thereof and a VSS power rail located on a bottom side thereof, with top and bottom referring to a plan view, and relating to the "height" describe above. Therefore, in the related art, the height of the standard cell may have a fixed value, and it may be difficult to form active regions having various widths in the standard cells. That is, design optimization may be difficult.

In the present disclosure, the standard cell may include an inverter or a NAND logic circuit. The inverter and the NAND logic circuit may have basic circuit configurations, and are exemplified in order to facilitate understanding of the technical spirit of the present disclosure. However, various other logic circuits having basic components mentioned in the present disclosure also fall within the technical spirit of the present disclosure.

Figure 1A:
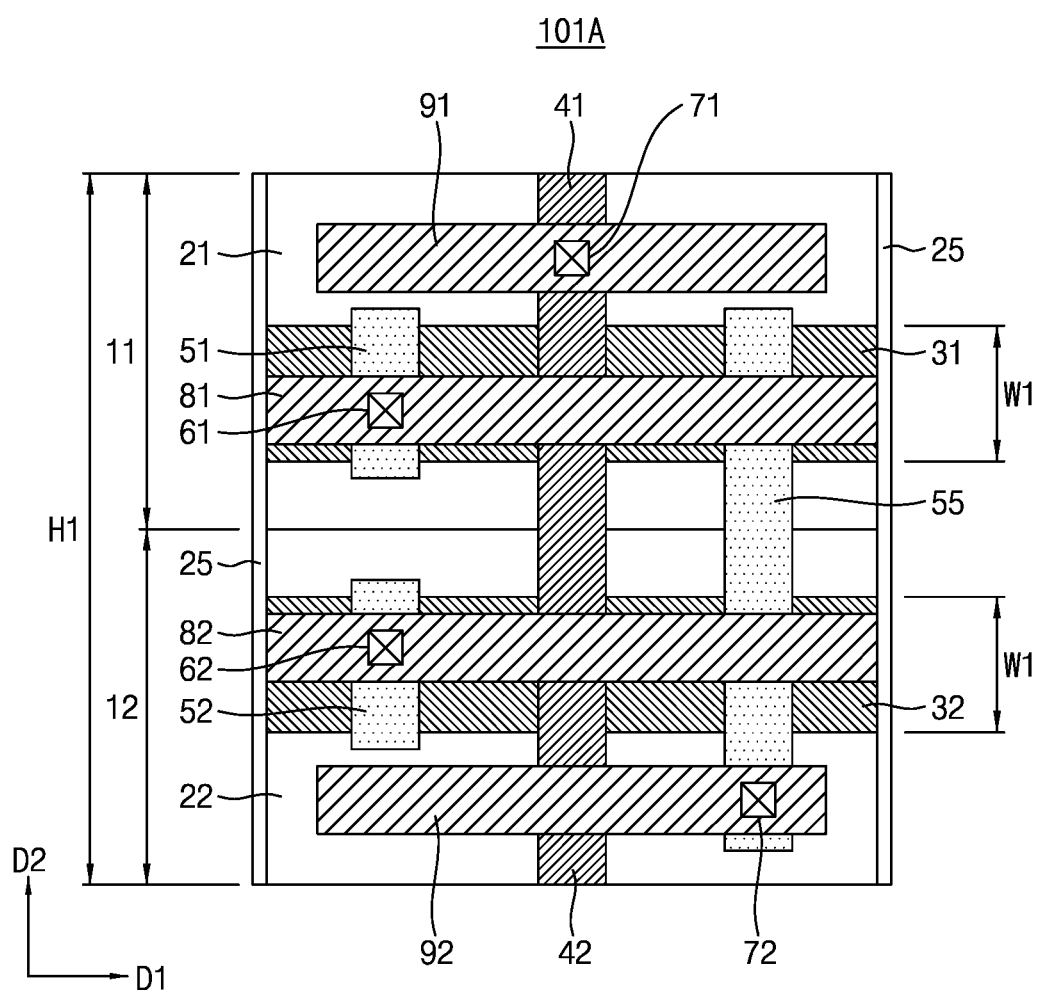
FIG. 1A is a layout illustrating a standard cell 101A according to an exemplary embodiment of the present disclosure.

FIG. 1A is a layout illustrating a standard cell 101A according to an exemplary embodiment of the present disclosure.

Referring to FIG. 1A, the standard cell 101A according to an exemplary embodiment of the present disclosure may include a first metal-oxide-semiconductor (MOS) region 11, a second MOS region 12, a common contact pad 55, and a diffusion break 25. The first MOS region 11 may include a first well region 21, a first active region 31, a first gate electrode 41, a first contact pad 51, a first power via plug 61, a first signal via plug 71, a first power rail 81, and a first signal line 91. The second MOS region 12 may include a second well region 22, a second active region 32, a second gate electrode 42, a second contact pad 52, a second power via plug 62, a second signal via plug 72, a second power rail 82, and a second signal line 92. The common contact pad 55 may be disposed across the first MOS region 11 and the second MOS region 12. The diffusion break 25 may be disposed adjacent to each of opposite side surfaces of the first MOS region 11 and the second MOS region 12.

The first MOS region 11 may include a P-type MOS (PMOS). For example, the PMOS may be disposed and formed in the first MOS region 11. For example, the first well region 21 may be an N-doped (or N-type) well for forming a P-type channel.

The first active region 31 may include a P-doped (or P-type) region. The first active region 31 may include a polysilicon, an epitaxial growth layer such as one or more fins, a nanowire, or a nanosheet. The first active region 31 may have the shape of a line, bar, or segment that extends in a first direction D1 (e.g. a row direction).

The first gate electrode 41 may extend lengthwise in a second direction D2 (e.g. a column direction). For example, from a top (e.g., plan) view, the first gate electrode 41 may have the shape of a line, bar, or segment that extends in the second direction D2. The first gate electrode 41 may be disposed across the first well region 21 and the first active region 31 in the second direction D2.

The first contact pad 51 may overlap a portion of the first active region 31, and may be disposed across the first active region 31. The first contact pad 51 may be electrically connected to a portion of the first active region 31. The first contact pad 51 may have the shape of a segment that extends in the second direction D2.

The first power via plug 61 may be disposed at the intersection between the first contact pad 51 and the first power rail 81. For example, the first power via plug 61 may be disposed so as to overlap the first contact pad 51 and the first power rail 81. The first power via plug 61 may electrically and vertically connect the first contact pad 51 to the first power rail 81. The power rail 81 may be disposed at a vertical level higher than a vertical level of the first contact pad 51 (e.g., in a direction perpendicular to first and second directions D1 and D2). Accordingly, the first power via plug 61 may transmit a first power, for example, a VDD power, from the first power rail 81 to the first contact pad 51. The VDD power may have various positive voltages greater than 0V.

The first signal via plug 71 may be disposed at the intersection between the first gate electrode 41 and the first signal line 91. For example, the first signal via plug 71 may be disposed so as to overlap the first gate electrode 41 and the first signal line 91. The first signal via plug 71 may electrically and vertically connect the first gate electrode 41 to the first signal line 91. In an exemplary embodiment, the first signal via plug 71 may transmit an input signal from the first signal line 91 to the first gate electrode 41.

The first power rail 81 may have the shape of a line that extends lengthwise in the first direction D1. In a top view, i.e. in the layout, the first power rail 81 may be disposed closer to a bottom side of the first MOS region 11 than to a top side of the first MOS region 11. For example, the first power rail 81 may be disposed closer to the boundary between the first MOS region 11 and the second MOS region 12 than to the top side of the first MOS region 11 opposite the boundary. In a top view, the first power rail 81 may overlap the first active region 31, and may cross the first active region 31 in the first direction D1. In a top view or layout, the first power rail 81 and the first gate electrode 41 may intersect each other perpendicularly in/on the first active region 31. In an exemplary embodiment, the first power rail 81 may transmit and supply the first power, for example, the VDD power. For example, the first power rail 81 may be a VDD power rail. An item, layer, or portion of an item or layer described as extending "lengthwise" in a particular direction has a length in the particular direction and a width perpendicular to that direction, where the length is greater than the width.

The first signal line 91 may have the shape of a line or segment that extends parallel to the first power rail 81. The first signal line 91 may be an input line that transmits and provides an input signal of the logic circuit provided by the standard cell 101A.

The first active region 31 may be defined by a first drain region and a first source region. For example, the first active region 31 and the first gate electrode 41 may form a PMOS transistor. The portion of the first active region 31 that overlaps the first contact pad 51 may correspond to the first source region, i.e. the source region of the PMOS transistor, and the portion of the first active region 31 that overlaps the common contact pad 55 may correspond to the first drain region, i.e. the drain region of the PMOS transistor.

The second MOS region 12 may include an N-type MOS (NMOS). For example, the NMOS may be disposed and formed in the second MOS region 12. For example, the second well region 22 may be a P-doped (or P-type) well for forming an N-type channel.

The second active region 32 may include an N-doped (or N-type) region. The second active region 32 may include a polysilicon, an epitaxial growth layer such as one or more fins, a nanowire, or a nanosheet. The second active region 32 may have the shape of a line, bar, or segment that extends in the first direction D1.

The second gate electrode 42 may extend in the second direction D2. For example, in a top view, the second gate electrode 42 may have the shape of a line, bar, or segment that extends in the second direction D2. The second gate electrode 42 may be disposed across the second well region 22 and the second active region 32 in the second direction D2.

The second contact pad 52 may overlap a portion of the second active region 32, and may be disposed across the second active region 32. The second contact pad 52 may be electrically connected to a portion of the second active region 32. The second contact pad 52 may have the shape of a segment that extends in the second direction D2.

The second power via plug 62 may be disposed at the intersection between the second contact pad 52 and the second power rail 82. For example, the second power via plug 62 may be disposed so as to overlap the second contact pad 52 and the second power rail 82. The second power via plug 62 may electrically and vertically connect the second contact pad 52 to the second power rail 82. For example, the second power via plug 62 may transmit a second power, for example, a VSS power (or a ground voltage), from the second power rail 82 to the second contact pad 52. In some examples, the VSS power may be a negative voltage less than the ground voltage.

The second signal via plug 72 may be disposed at the intersection between the common contact pad 55 and the second signal line 92. For example, the second signal via plug 72 may be disposed so as to overlap the second gate electrode 42 and the second signal line 92. The second signal via plug 72 may electrically and vertically connect the common contact pad 55 to the second signal line 92. In an exemplary embodiment, the second signal via plug 72 may transmit an output signal from the common contact pad 55 to the second signal line 92.

The second power rail 82 may have the shape of a line that extends in the first direction D1. In a top view, i.e. in the layout, the second power rail 82 may be disposed closer to the top side of the second MOS region 12 than to the bottom side of the second MOS region 12. For example, the second power rail 82 may be disposed closer to the boundary between the first MOS region 11 and the second MOS region 12 than to the bottom side of the second MOS region 12 opposite the boundary. In a top view the second power rail 82 may overlap the second active region 32, and may cross the second active region 32 in the first direction D1. In a top view or layout, the second power rail 82 and the second gate electrode 42 may intersect each other perpendicularly in/on the second active region 32. In an exemplary embodiment, the second power rail 82 may transmit and supply the second power, e.g. VSS power. For example, the second power rail 82 may be a VSS power rail.

The second signal line 92 may have the shape of a line or segment that extends parallel to the second power rail 82. The second signal line 92 may be an output line that transmits and outputs an output signal of the logic circuit provided by the standard cell 101A.

The second active region 32 may be defined by a second drain region and a second source region. For example, the second active region 32 and the second gate electrode 42 may form an NMOS transistor. The portion of the second active region 32 that overlaps the second contact pad 52 may correspond to the second source region, i.e. the source region of the NMOS transistor, and the portion of the second active region 32 that overlaps the common contact pad 55 may correspond to the second drain region, i.e. the drain region of the NMOS transistor.

The first gate electrode 41 and the second gate electrode 42 may be physically separated from each other. For example, a gate-cut pattern including an insulating material may be interposed between the first gate electrode 41 and the second gate electrode 42. In an exemplary embodiment, the first gate electrode 41 and the second gate electrode 42 may be electrically and materially connected to each other. For example, the first gate electrode 41 and the second gate electrode 42 may form a single common gate electrode. For example, the first gate electrode 41 and the second gate electrode 42 may be parts of the common gate electrode. The first gate electrode 41 and the second gate electrode 42 may be electrically connected to the first signal line 91 and the first signal via plug 71, and thus may be enabled simultaneously.

The common contact pad 55 may overlap a portion of the first active region 31 and a portion of the second active region 32, and may be connected thereto. For example, the common contact pad 55 may cross the first active region 31 and the second active region 32 in the second direction D2, and may have a segment shape. The common contact pad 55 may be electrically connected to the first active region 31 and to the second active region 32.

The diffusion break 25 may be interposed between the active regions 31 and 32, which are adjacent to each other in the first direction D1. The diffusion break 25 may include an insulating material. The diffusion break 25 may electrically insulate the active regions 31 and 32, which are adjacent to each other in the first direction D1, from each other. For example, the diffusion break 25 may be disposed at opposite sides of the standard cell 101A in the first direction D1.

FIGS. 1B to 1E are layouts illustrating standard cells 101B to 101E according to exemplary embodiments of the present disclosure.

Figure 1B:
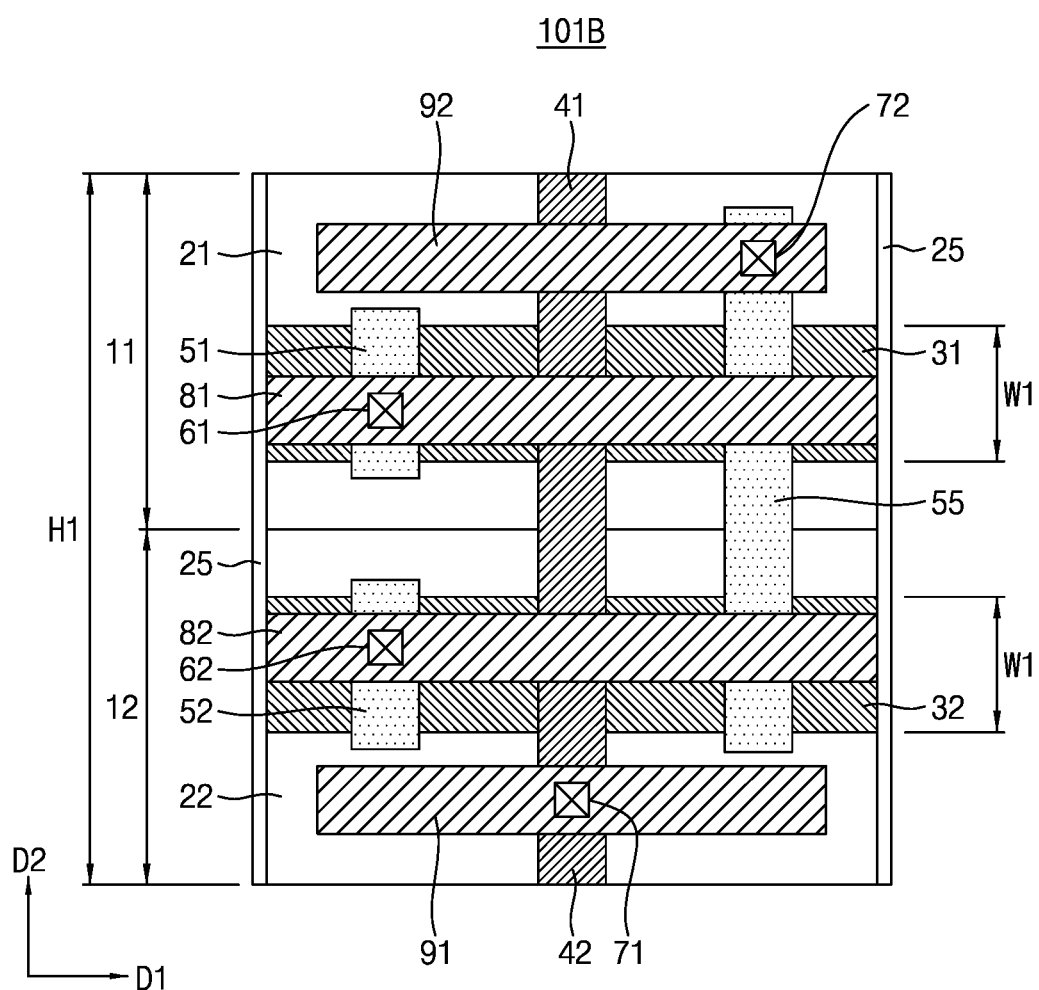
FIGS. 1B to 1E are layouts illustrating standard cells 101B to 101E according to exemplary embodiments of the present disclosure.

Referring to FIG. 1B, the standard cell 101B according to an exemplary embodiment of the present disclosure, may include a first signal via plug 71 and a first signal line 91 which are disposed in a second MOS region 12, and a second signal via plug 72 and a second signal line 92 which are disposed in a first MOS region 11, unlike the standard cell 101A of FIG. 1A.

Figure 1C:
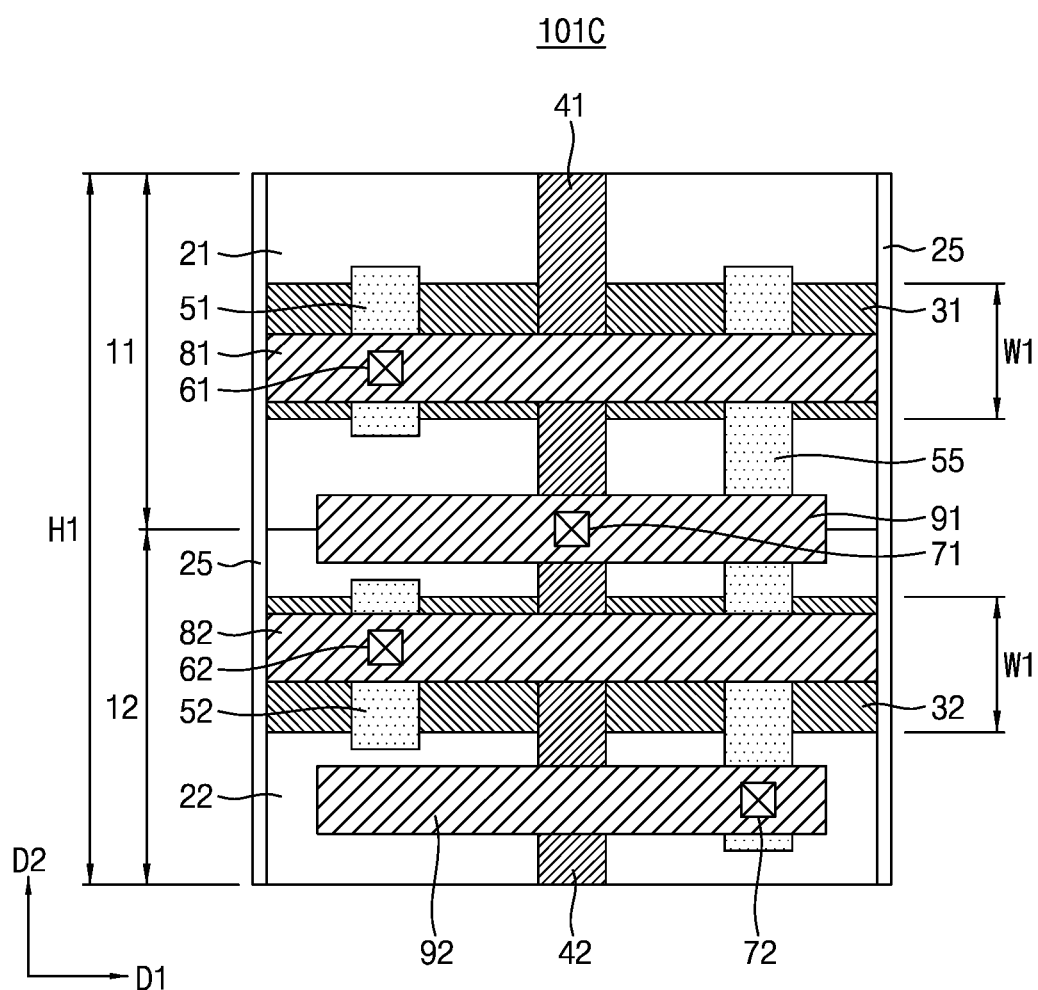

Referring to FIG. 1C, the standard cell 101C according to an exemplary embodiment of the present disclosure may include a first signal via plug 71 and a first signal line 91, which are disposed between a first power rail 81 and a second power rail 82, unlike the standard cell 101A of FIG. 1A.

Figure 1D:
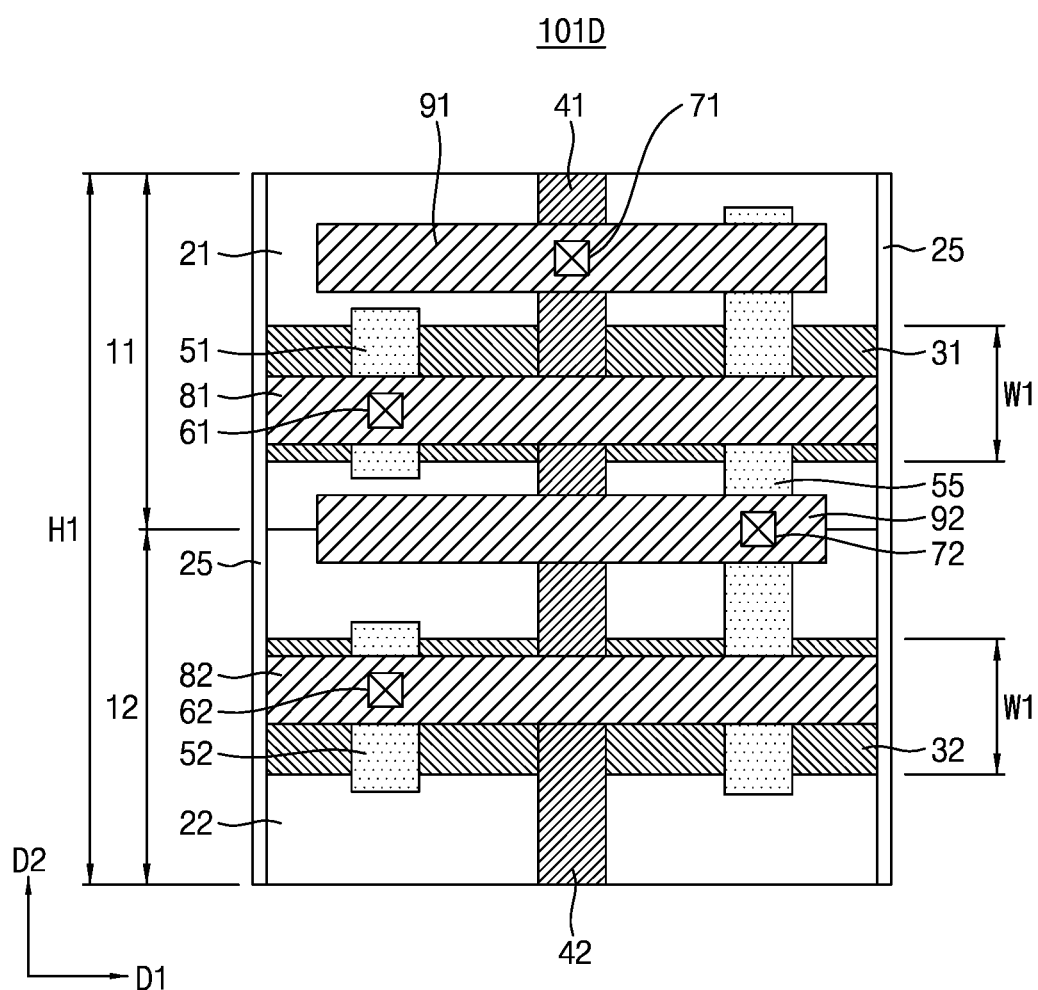

Referring to FIG. 1D, the standard cell 101D according to an exemplary embodiment of the present disclosure may include a second signal via plug 72 and a second signal line 92, which are disposed between a first power rail 81 and a second power rail 82, unlike the standard cell 101A of FIG. 1A.

In an exemplary embodiment, all of the first signal via plug 71, the first signal line 91, the second signal via plug 72, and the second signal line 92 may be disposed between the first power rail 81 and the second power rail 82.

Figure 1E:
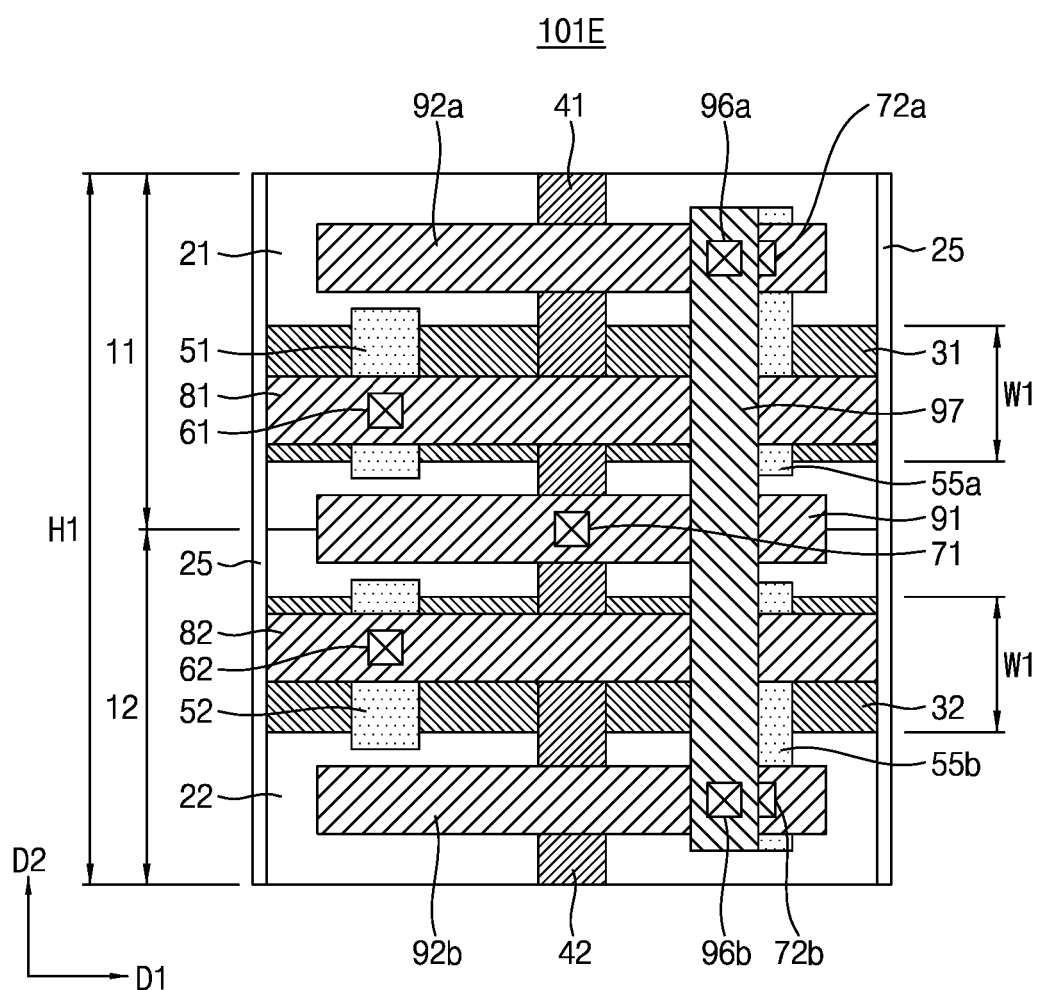

Referring to FIG. 1E, the standard cell 101E according to an exemplary embodiment of the present disclosure may include a first signal via plug 71 and a first signal line 91 which are disposed between a first power rail 81 and a second power rail 82, a second upper signal via plug 72*a* and a second upper signal line 92*a* which are disposed in a first MOS region 11, a second lower signal via plug 72*b* and a second lower signal line 92*b* which are disposed in a second MOS region 12, a first common contact pad 55*a* and a second common contact pad 55*b*, a first output via plug 96*a* and a second output via plug 96*b*, and an output line 97. The common contact pad 55 of FIGS. 1A to 1D may be divided into the first common contact pad 55*a* and the second common contact pad 55*b*. For example, the first common contact pad 55*a* may be located in the first MOS region 11. The first common contact pad 55*a* may overlap the first drain region of the first active region 31 and the second upper signal line 92*a*, and may be electrically connected thereto. The second common contact pad 55*b* may be located in the second MOS region 12. The second common contact pad 55*b* may overlap the second drain region of the second active region 32 and the second lower signal line 92*b*, and may be electrically connected thereto. The first output via plug 96*a* may connect the second upper signal line 92*a* to the output line 97. The second output via plug 96*b* may connect the second lower signal line 92*b* to the output line 97. The output line 97 may extend in the column direction. The output line 97 may be disposed on the second upper and lower signal lines 92*a* and 92*b*. The first output via plug 96*a* may partially overlap the second upper signal via plug 72*a*, the second output via plug 96*b* may partially overlap the second lower signal via plug 72*b*, and the output line 97 may partially overlap the first common contact pad 55*a* and the second common contact pad 55*b*.

FIGS. 1A to 1E illustrate a configuration in which each of the first active region 31 in the first MOS region 11 and the second active region 32 in the second MOS region 12 has a first width W1 and each of the standard cells 101A to 101E has a first height H1. In an exemplary embodiment, the length or the width of the first MOS region 11 in the second direction D2 may be ½ of the height H1 of each of the standard cells 101A to 101E. For example, the length or the width of the second MOS region 12 in the second direction D2 may also be ½ of the height H1 of each of the standard cells 101A to 101E.

In another exemplary embodiment, the first signal line 91 and the second signal line 92 may be interchanged in a function and in a position. For example, the first signal line 91 may be electrically connected to the common contact pad 55, and the second signal line 92 may be electrically connected to the common gate electrodes 41 and 42. For example, the first signal line 91 may be an output line, and the second signal line 92 may be an input line.

Figure 2A:
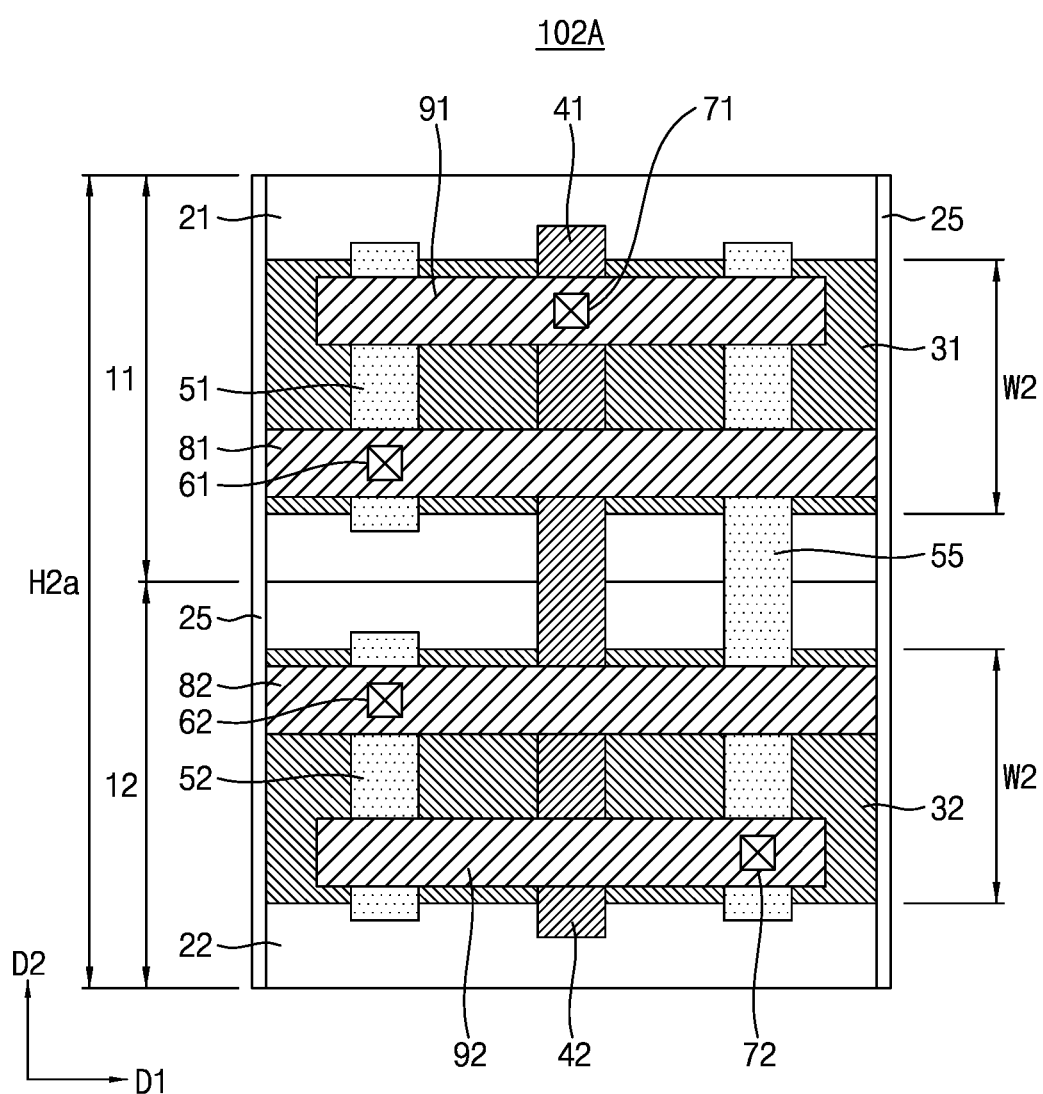
FIGS. 2A to 2C are layouts illustrating standard cells 102A to 102C according to various embodiments of the present disclosure.
Figure 2B:
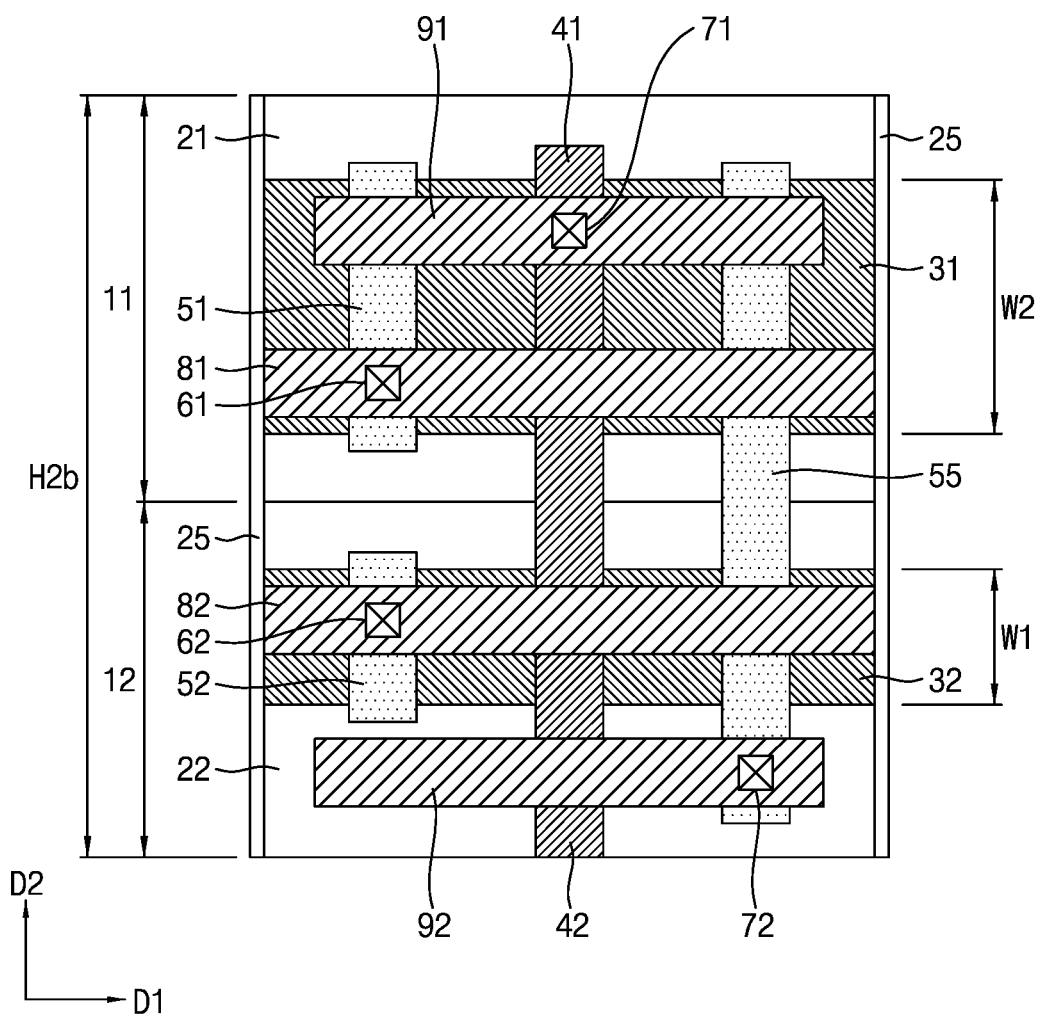
Figure 2C:
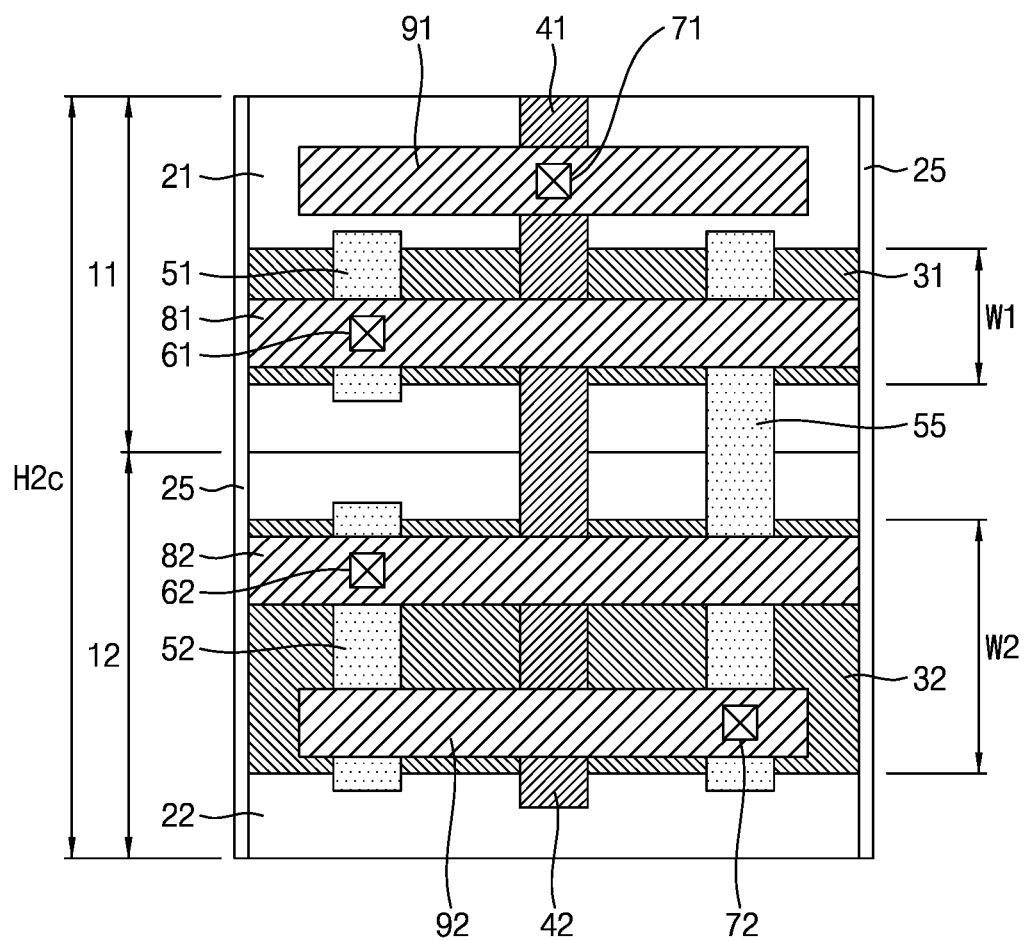

FIGS. 2A to 2C are layouts illustrating standard cells 102A to 102C according to various embodiments of the present disclosure. Hereinafter, the same description as the above description about the standard cells 101A to 101E with reference to FIGS. 1A to 1E, respectively, will be omitted to avoid redundancy.

Referring to FIG. 2A, the standard cell 102A according to an exemplary embodiment of the present disclosure may include a first active region 31 and a second active region 32, each having a second width W2, unlike the standard cell 101 of FIG. 1. Hereinafter, it is assumed that the second width W2 may be greater than the first width W1 (W1<W2). For example, the widths of the first active region 31 in the first MOS region 11 and the second active region 32 in the second MOS region 12 may be expanded. A height H2*a* of the standard cell 102A may be greater than the height H1 of each of the standard cells 101A to 101E of FIG. 1A to 1E. In another exemplary embodiment, the height H2*a* of the standard cell 102A may be the same as the height H1 of the standard cell 101 of FIG. 1A to 101E of FIG. 1A to 1E.

In a top view, the first power rail 81 and the first signal line 91 may overlap the first active region 31, and the second power rail 82 and the second signal line 92 may overlap the second active region 32. In an exemplary embodiment, the first power rail 81 and the first signal line 91 may partially overlap the first active region 31. In addition, the second power rail 82 and the second signal line 92 may also partially overlap the second active region 32. Since the widths of the first active region 31 and the second active region 32 are expanded, the driving performance, channel resistance, short channel effect, and/or other characteristics of the transistors may be improved. As the areas of the first active region 31 and the second active region 32 are increased, the contact resistances of the first contact pad 51, the second contact pad 52, and the common contact pad 55 in the first and second active regions 31 and 32 may be reduced.

Referring to FIGS. 2B and 2C, each of the standard cells 102B and 102C according to exemplary embodiments of the present disclosure may include first and second active regions 31 and 32 having different widths W1 and W2 from each other. For example, the standard cell 102B of FIG. 2B may include a first active region 31 having a second width W2 and a second active region 32 having a first width W1. The standard cell 102C of FIG. 2C may include a first active region 31 having a first width W1 and a second active region 32 having a second width W2. For example, the first MOS region 11 or the second MOS region 12 may be expanded. For example, heights H2*b* and H2*c* of the standard cells 102B and 102C may be expanded. In another exemplary embodiment, the heights H2*b* and H2*c* of the standard cells 102B and 102C may be the same as the height H1 of each of the standard cells 101A to 101E of FIG. 1A to 1E.

Referring to FIG. 2B, the first power rail 81 and the first signal line 91 may overlap the first active region 31, and the second power rail 82 may overlap the second active region 32. Since the width of the first active region 31 is expanded, the driving performance, channel resistance, short channel effect, and/or other characteristics of the transistor in the first MOS region 11 may be improved. The contact resistances of the first contact pad 51 and the common contact pad 55 in the first active region 31 may be reduced. Accordingly, the characteristics of the PMOS may be improved.

Referring to FIG. 2C, the first power rail 81 may overlap the first active region 31, and the second power rail 82 and the second signal line 92 may overlap the second active region 32. Since the width of the second active region 32 is expanded, the driving performance, channel resistance, short channel effect, and/or other characteristics of the transistor in the second MOS region 12 may be improved. The contact resistances of the second contact pad 52 and the common contact pad 55 in the second active region 32 may be reduced. Accordingly, the characteristics of the NMOS may be improved.

The technical spirit described with reference to FIGS. 1B to 1E may also be applied to the standard cells 102A to 102C illustrated in FIGS. 2A to 2C. For example, in FIGS. 2A to 2C, referring to FIG. 1B, the first signal via plug 71 and the first signal line 91 may be disposed in the second MOS region 12, and the second signal via plug 72 and the second signal line 92 may be disposed in the first MOS region 11. In FIGS. 2A to 2C, referring to FIG. 1C, the first signal via plug 71 and the first signal line 91 may be disposed between the first power rail 81 and the second power rail 82. In FIGS. 2A to 2C, referring to FIG. 1D, the second signal via plug 72 and the second signal line 92 may be disposed between the first power rail 81 and the second power rail 82. In an exemplary embodiment, all of the first signal via plug 71, the first signal line 91, the second signal via plug 72, and the second signal line 92 may be disposed between the first power rail 81 and the second power rail 82. In FIGS. 2A to 2C, referring to FIG. 1E, the first signal via plug 71 and the first signal line 91 may be disposed between the first power rail 81 and the second power rail 82, the second upper signal via plug 72a and the second upper signal line 92a may be disposed in the first MOS region 11, and the second lower signal via plug 72b and the second lower signal line 92b may be disposed in the second MOS region 12. In an exemplary embodiment, the first signal via plug 71 and the second signal via plugs 72a and 72b may be interchanged, and the first signal line 91 and the second signal lines 92a and 92b may be interchanged. For example, the first upper signal via plug 71a and the first upper signal line 91a may be disposed in the first MOS region 11, and the second lower signal via plug 71b and the second lower signal line 91b may be disposed in the second MOS region 12.

Figure 3A:
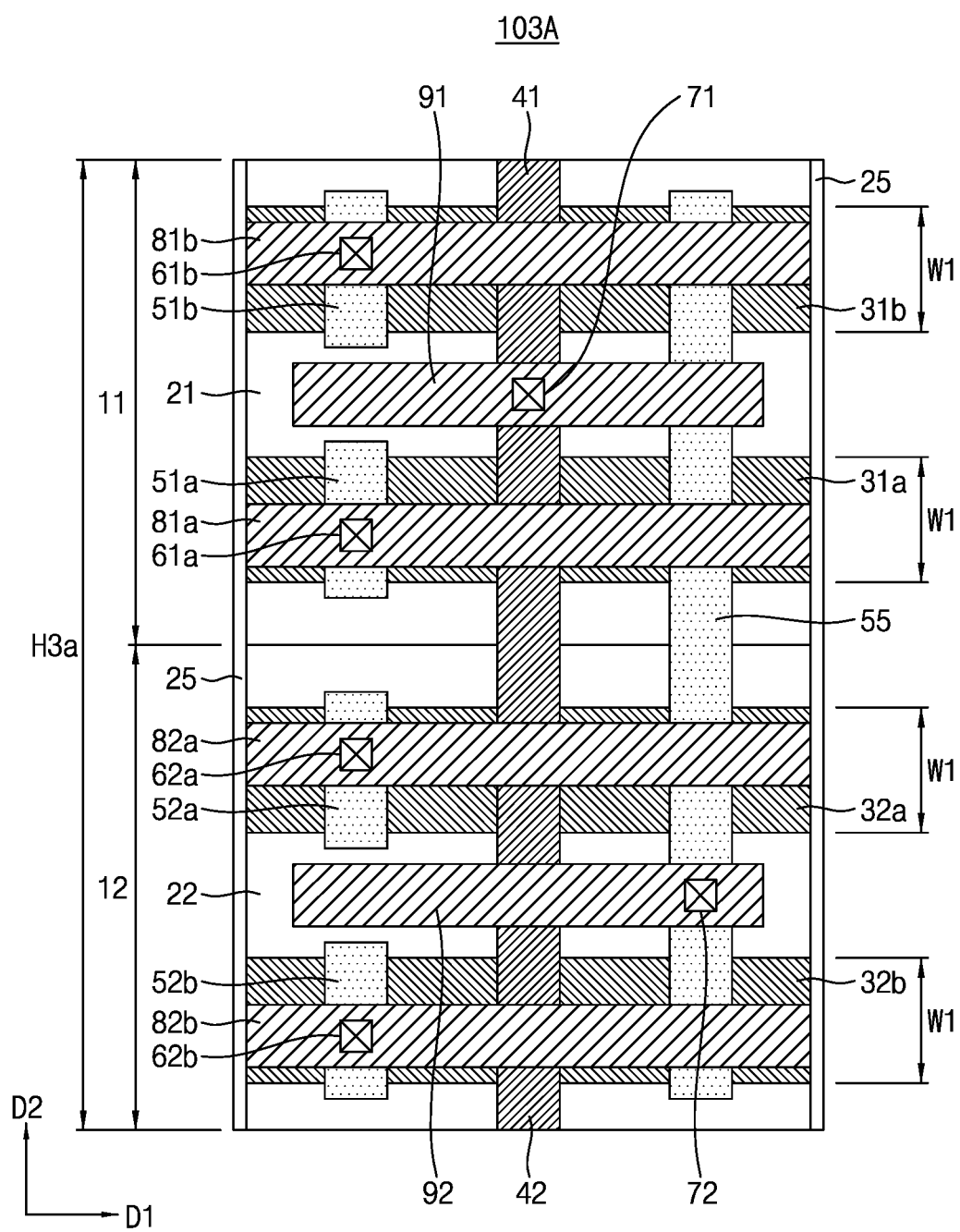
FIGS. 3A to 3C are views illustrating standard cells 103A to 103C according to various embodiments of the present disclosure. An illustration of some components is omitted in order to reduce the complexity of the drawings.
Figure 3B:
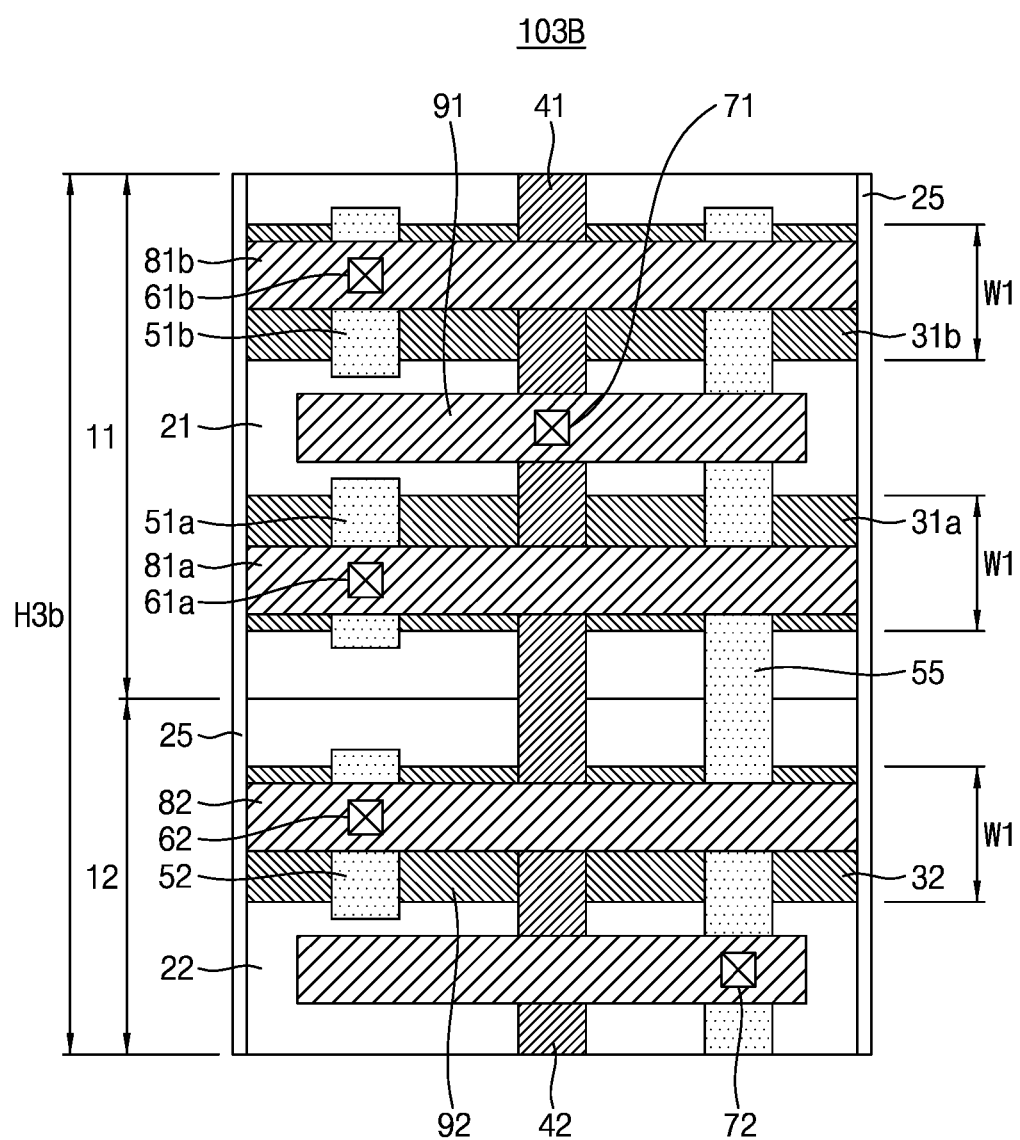
Figure 3C:
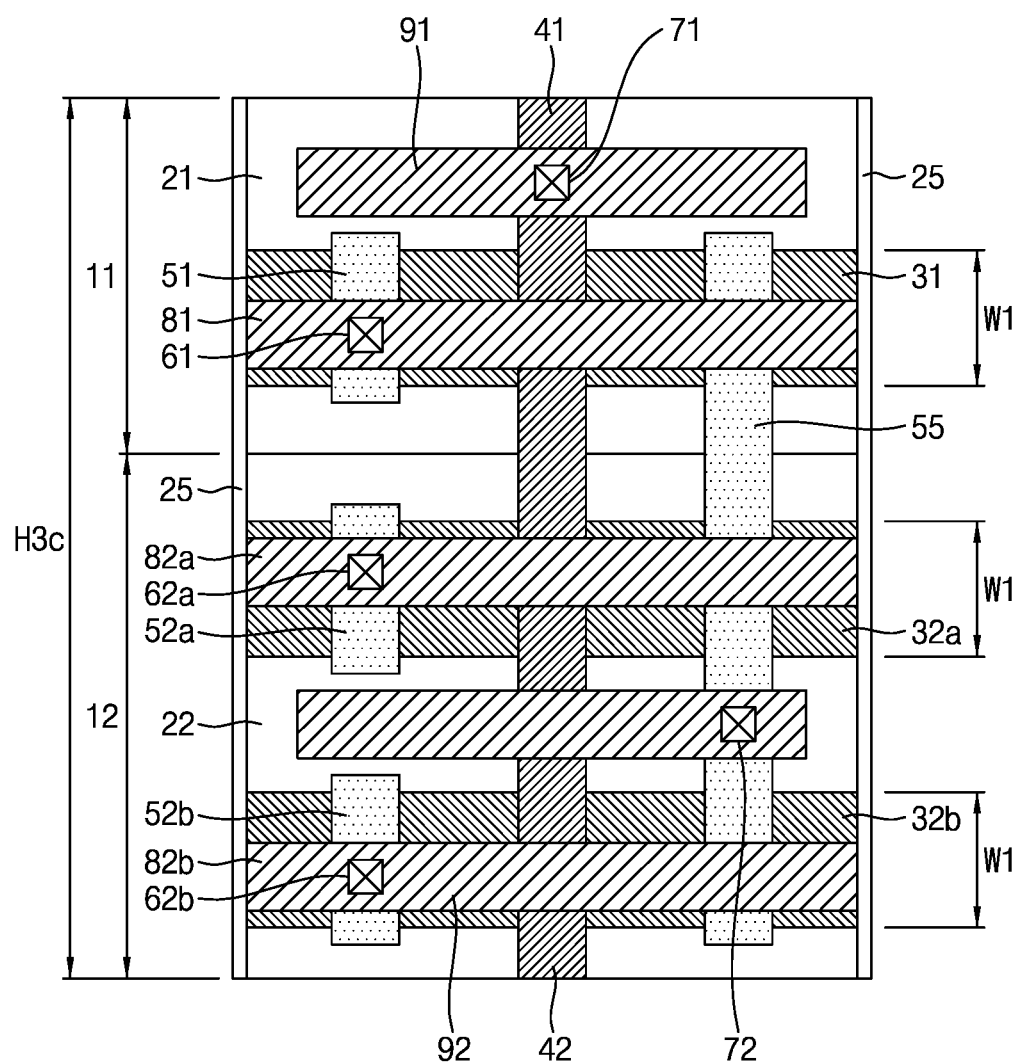

FIGS. 3A to 3C are views illustrating standard cells 103A to 103C according to various embodiments of the present disclosure. An illustration of some components is omitted in order to reduce the complexity of the drawings. Hereinafter, the same description as the above description about the standard cells 101A to 101E and 102A to 102C with reference to FIGS. 1A to 1E and 2A to 2C, respectively, will be omitted to avoid redundancy.

Referring to FIG. 3A, a standard cell 103A according to an exemplary embodiment of the present disclosure may include a plurality of first active regions 31a and 31b in a first MOS region 11 and a plurality of second active regions 32a and 32b in a second MOS region 12. For example, the standard cell 103A may include a first inner active region 31a, a first outer active region 31b, a first gate electrode 41, a first inner contact pad 51a, a first outer contact pad 51b, a first inner power via plug 61a, a first outer power via plug 61b, a first signal via plug 71, a first inner power rail 81a, a first outer power rail 81b, and a first signal line 91 on a first well region 21 in the first MOS region 11, and may further include a second inner active region 32a, a second outer active region 32b, a second gate electrode 42, a second inner contact pad 52a, a second outer contact pad 52b, a second inner power via plug 62a, a second outer power via plug 62b, a second signal via plug 72, a second inner power rail 82a, a second outer power rail 82b, and a second signal line 92 on a second well region 22 in the second MOS region 12. Hereinafter, an inner active region and an outer active region may be spaced apart from each other in the second direction D2.

For convenience of description, components located close to the center of each of the standard cells 103A to 103C will be referred to as inner components, and components located close to the upper or lower side of each of the standard cells 103A to 103C will be referred to as outer components. For example, each of the first inner active region 31a, the first outer active region 31b, the second inner active region 32a, and the second outer active region 32b may have the same width W1. The standard cells 103A to 103C of the embodiments may have heights H3a, H3b and H3c, respectively, greater than those of the standard cells 101A to 101E of FIGS. 1A to 1E and/or the standard cells 102A to 102C of FIGS. 2A to 2C.

The first inner active region 31a may overlap the first inner power rail 81a. The first inner contact pad 51a may be disposed across the first inner active region 31a in the second direction D2. The first inner power via plug 61a may electrically connect the first inner power rail 81a to the first inner contact pad 51a.

The first outer active region 31b may overlap the first outer power rail 81b. The first outer contact pad 51b may be disposed across the first outer active region 31b in the second direction D2. The first outer power via plug 61b may electrically connect the first outer power rail 81b to the first outer contact pad 51b.

The second inner active region 32a may overlap the second inner power rail 82a. The second inner contact pad 52a may be disposed across the second inner active region 32a in the second direction D2. The second inner power via plug 62a may electrically connect the second inner power rail 82a to the second inner contact pad 52a.

The second outer active region 32b may overlap the second outer power rail 82b. The second outer contact pad 52b may be disposed across the second outer active region 32b in the second direction D2. The second outer power via plug 62b may electrically connect the second outer power rail 82b to the second outer contact pad 52b.

The common contact pad 55 may cross the first inner active region 31a, the first outer active region 31b, the second inner active region 32a, and the second outer active region 32b in the second direction D2.

The first signal line 91 may be disposed between the first inner active region 31a and the first outer active region 31b. In an exemplary embodiment, the first signal line 91 may be disposed between the first inner power rail 81a and the first outer power rail 81b.

The second signal line 92 may be disposed between the second inner active region 32a and the second outer active region 32b. In an exemplary embodiment, the second signal line 92 may be disposed between the second inner power rail 82a and the second outer power rail 82b.

The first inner power rail 81a, the first outer power rail 81b, the first signal line 91, the second inner power rail 82a, the second outer power rail 82b, and the second signal line 92 may extend parallel to each other in the first direction D1.

For example, the standard cell 103A may have two PMOSs connected in parallel and two NMOSs connected in parallel.

According to the embodiment, a plurality of active regions 31a, 31b, 32a and 32b, each having a standardized width W1, may be provided in a single standard cell 103A. Accordingly, the plurality of active regions 31a, 31b, 32a and 32b having a uniform dimension may be stably formed through a standardized manufacturing process. In other exemplary embodiments, two or more first active regions 31a and 31b may be disposed in the first MOS region 11 of the standard cell 103A, and two or more second active regions 32a and 32b may be disposed in the second MOS region 12 of the standard cell 103A. The plurality of active regions 31a, 31b, 32a and 32b may have the same width W1. In another exemplary embodiment, each of the plurality of active regions 31a, 31b, 32a and 32b may have a second width W2. It is to be understood that the plurality of active regions 31a, 31b, 32a and 32b may have various widths.

Referring to FIGS. 3B and 3C, standard cells 103B and 103C according to exemplary embodiments of the present disclosure may selectively include a plurality of first or second active regions 31a, 31b, 32a and 32b having the same width W1. For example, the standard cell 103B of FIG. 3B may include a plurality of first active regions 31a and 31b, each having a first width W1, and the standard cell 103C of FIG. 3C may include a plurality of second active regions 32a and 32b, each having a first width W1. For example, in the case in which the number or characteristics of transistors in the first MOS region 11 is more important, the standard cell 103B of FIG. 3B may be applied, and in the case in which the number or characteristics of transistors in the second MOS region 12 is more important, the standard cell 103C of FIG. 3C may be applied.

The technical spirit described with reference to FIGS. 1B to 1E may also be applied to the standard cells 103A to 103C illustrated in FIGS. 3A to 3C. For example, in FIGS. 3A to 3C, referring to FIG. 1B, the first signal via plug 71 and the first signal line 91 may be disposed in the second MOS region 12, and the second signal via plug 72 and the second signal line 92 may be disposed in the first MOS region 11. In FIGS. 3A to 3C, referring to FIG. 1C, the first signal via plug 71 and the first signal line 91 may be disposed between the first power rail 81 and the second power rail 82 (e.g., between a first inner power rail 81a and a second inner power rail 82a, between a first inner power rail 81a and a second power rail 82, or between a first power rail 81 and a second inner power rail 82a). In FIGS. 3A to 3C, referring to FIG. 1D, the second signal via plug 72 and the second signal line 92 may be disposed between the first power rail 81 and the second power rail 82 (e.g., between a first inner power rail 81a and a second inner power rail 82a, between a first inner power rail 81a and a second power rail 82, or between a first power rail 81 and a second inner power rail 82a). In an exemplary embodiment, all of the first signal via plug 71, the first signal line 91, the second signal via plug 72, and the second signal line 92 may be disposed between the first power rail 81 and the second power rail 82 (e.g., between a first inner power rail 81a and a second inner power rail 82a, between a first inner power rail 81a and a second power rail 82, or between a first power rail 81 and a second inner power rail 82a). In FIGS. 3A to 3C, referring to FIG. 1E, the first signal via plug 71 and the first signal line 91 may be disposed between the first power rail 81 and the second power rail 82 (i.e., between 81a and 82a, between 81a and 82, or between 81 and 82a), the second upper signal via plug 72a and the second upper signal line 92a may be disposed in the first MOS region 11, and the second lower signal via plug 72b and the second lower signal line 92b may be disposed in the second MOS region 12. In an exemplary embodiment, the first signal via plug 71 and the second signal via plugs 72a and 72b may be interchanged, and the first signal line 91 and the second signal lines 92a and 92b may be interchanged. For example, the first upper signal via plug 71a and the first upper signal line 91a may be disposed in the first MOS region 11, and the second lower signal via plug 71b and the second lower signal line 91b may be disposed in the second MOS region 12.

Figure 4A:
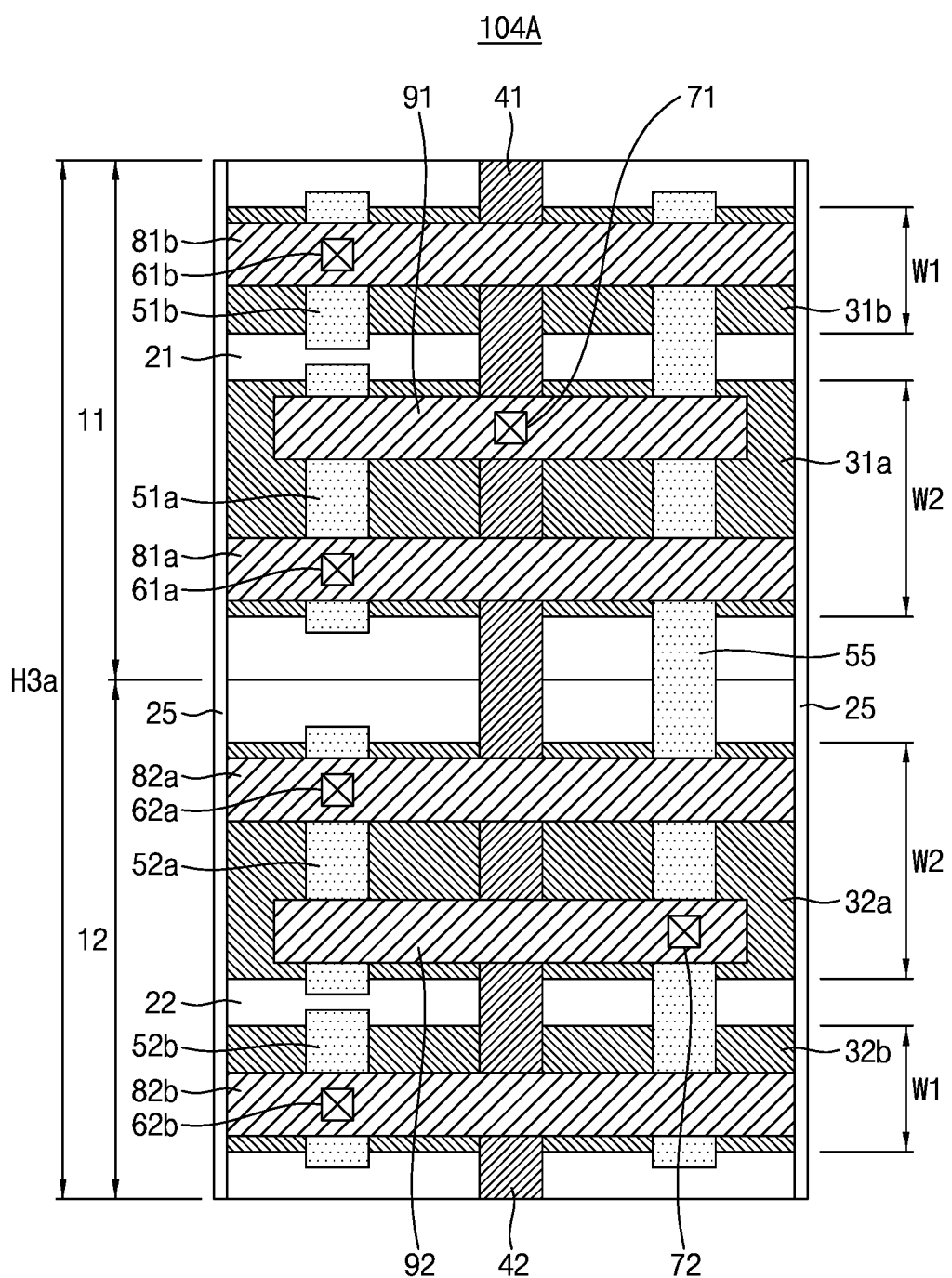
FIGS. 4A to 4C are layouts illustrating standard cells 104A to 104C according to various embodiments of the present disclosure.
Figure 4B:
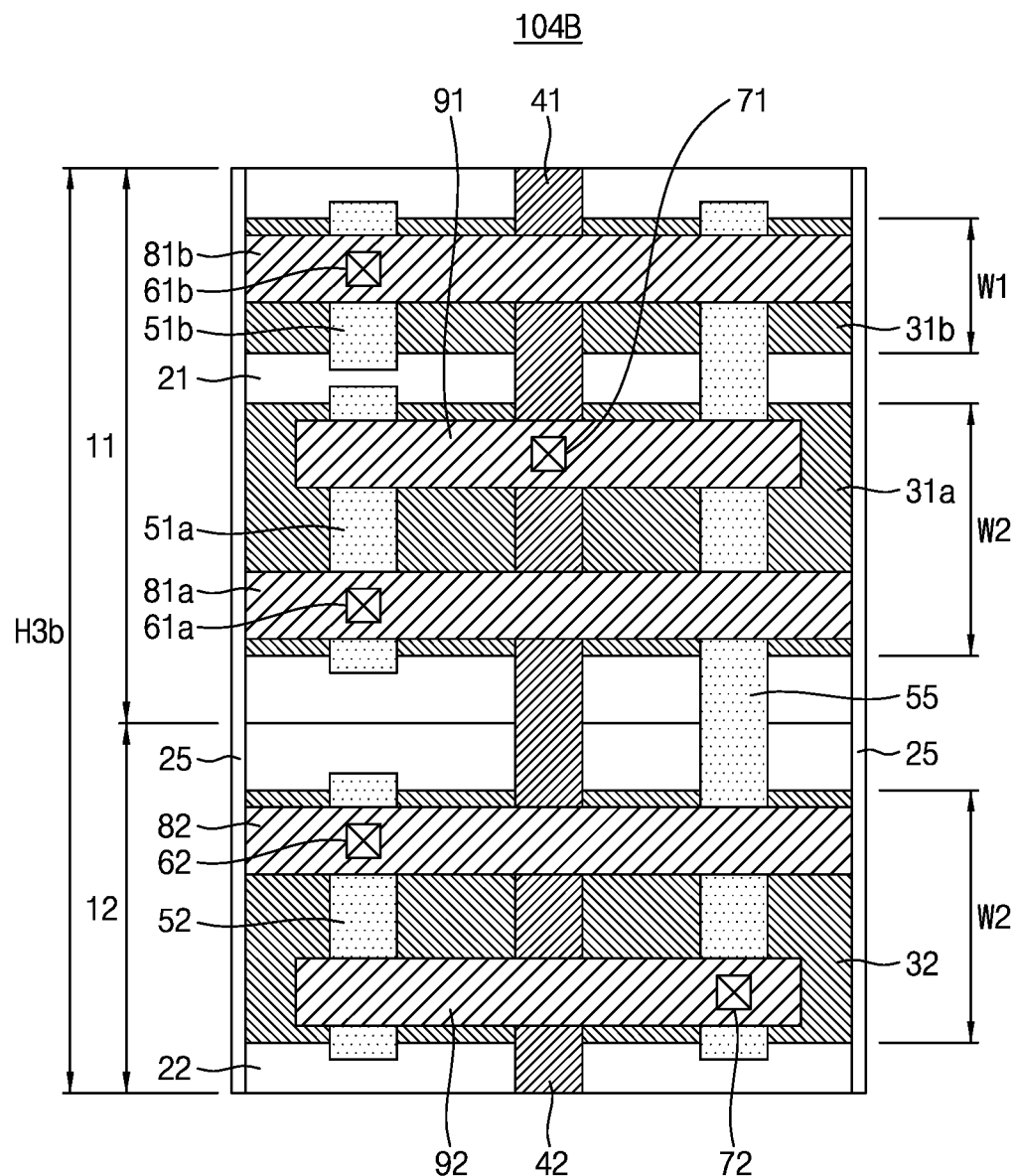
Figure 4C:
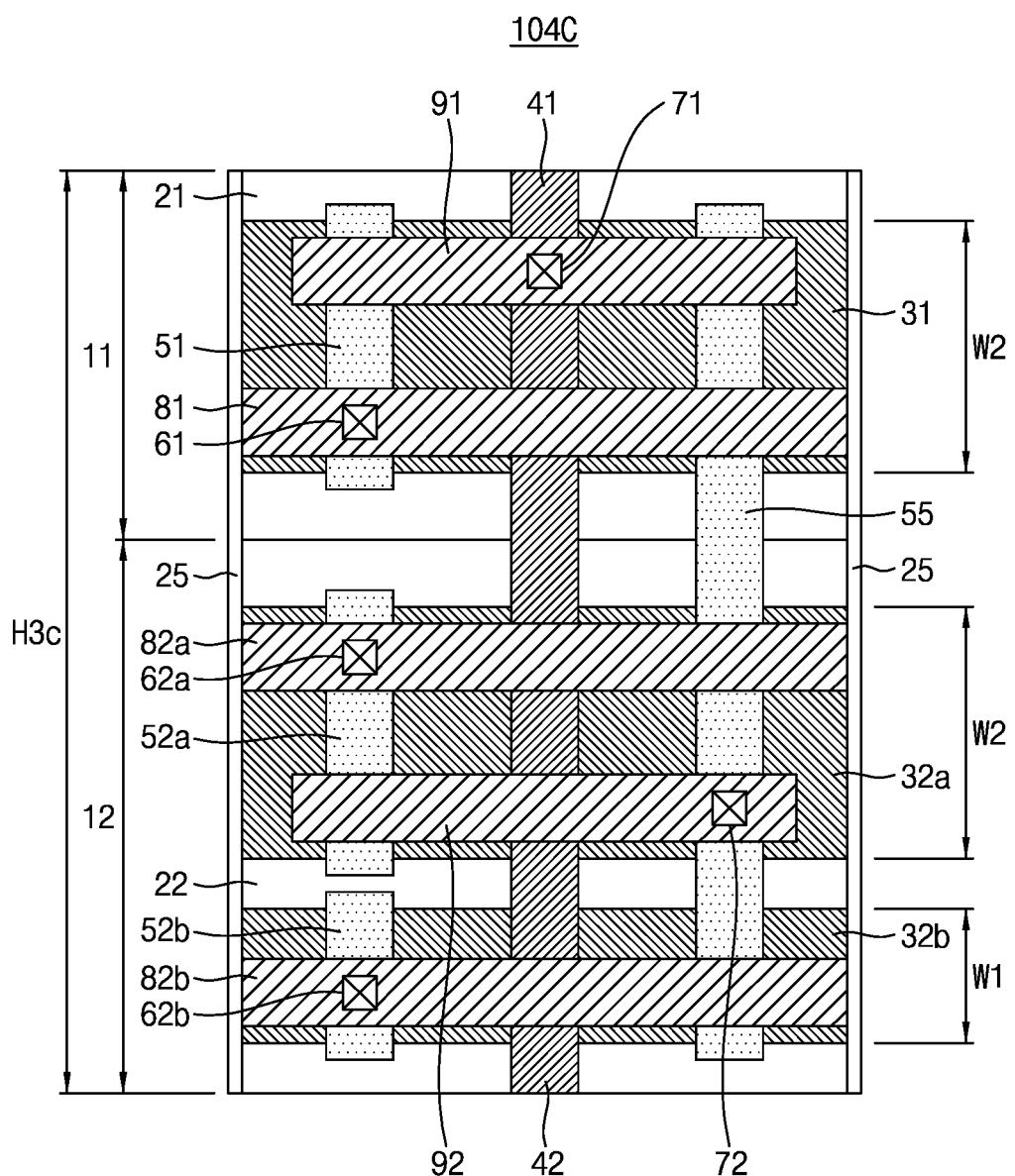

FIGS. 4A to 4C are layouts illustrating standard cells 104A to 104C according to various embodiments of the present disclosure. Hereinafter, the same description as the above description about the standard cells 101A to 101E, 102A to 102C, and 103A to 103C with reference to FIGS. 1A to 1E, 2A to 2C, and 3A to 3C, respectively, will be omitted to avoid redundancy.

Referring to FIG. 4A, the standard cell 104A according to an exemplary embodiment of the present disclosure may include a plurality of first active regions 31a and 31b and a plurality of second active regions 32a and 32b. The plurality of first and second active regions 31a, 31b, 32a and 32b may have various widths W1 and W2. For example, the first active regions 31a and 31b may include a first inner active region 31a having a second width W2 and a first outer active region 31b having a first width W1. The second active regions 32a and 32b may include a second inner active region 32a having the second width W2 and a second outer active region 32b having the first width W1. In an exemplary embodiment, the first inner active region 31a may have a first width W1, and the first outer active region 31b may have the second width W2. In an exemplary embodiment, the second inner active region 32a may have the first width W1, and the second outer active region 32b may have the second width W2.

For example, when two or more transistors (e.g., PMOSs) having different characteristics are used in the first MOS region 11, first active regions 31a and 31b having different widths W1 and W2 from each other may be disposed. Similarly, when two or more transistors (e.g., NMOSs) having different characteristics are used in the second MOS region 12, second active regions 32a and 32b having different widths W1 and W2 from each other may be disposed. For convenience of explanation of the technical spirit of the present disclosure, two widths W1 and W2 are representatively exemplified. According to various embodiments of the present disclosure, the first and second active regions 31a, 31b, 32a and 32b may have various widths.

The standard cells 104A to 104C of the various embodiments may have heights H4a, H4b and H4c, respectively, greater than those of the standard cells 103A to 103C of FIGS. 3A to 3C.

Referring to FIGS. 4B and 4C, standard cells 104B and 104C according to exemplary embodiments of the present disclosure may selectively include a plurality of first or second active regions 31a, 31b, 32a and 32b having different widths W1 and W2 from each other. For example, a standard cell 104B of FIG. 4B may include a first inner active region 31a having a second width W2 and a first outer active region 31b having a first width W1. A standard cell 104C of FIG. 4C may include a second inner active region 32a having a second width W2 and a second outer active region 32b having a first width W1. The standard cell 104B of FIG. 4B may include a second active region 32 having the second width W2. In an exemplary embodiment, the second active region 32 may have the first width W1. The standard cell 104C of FIG. 4C may include a first active region 31 having a second width W2. In an exemplary embodiment, the first active region 31 may have a first width W1.

The technical spirit described with reference to FIGS. 1B to 1E may also be applied to the standard cells 104A to 104C illustrated in FIGS. 4A to 4C. For example, in FIGS. 4A to 4C, referring to FIG. 1B, the first signal via plug 71 and the first signal line 91 may be disposed in the second MOS region 12, and the second signal via plug 72 and the second signal line 92 may be disposed in the first MOS region 11. In FIGS. 4A to 4C, referring to FIG. 1C, the first signal via plug 71 and the first signal line 91 may be disposed between the first power rail 81 and the second power rail 82. In FIGS. 4A to 4C, referring to FIG. 1D, the second signal via plug 72 and the second signal line 92 may be disposed between the first power rail 81 and the second power rail 82 (e.g., between a first inner power rail 81a and a second inner power rail 82a, between a first inner power rail 81a and a second power rail 82, or between a first power rail 81 and a second inner power rail 82*a*). In an exemplary embodiment, all of the first signal via plug 71, the first signal line 91, the second signal via plug 72, and the second signal line 92 may be disposed between the first power rail 81 and the second power rail 82 (e.g., between a first inner power rail 81*a* and a second inner power rail 82*a*, between a first inner power rail 81*a* and a second power rail 82, or between a first power rail 81 and a second inner power rail 82*a*). In FIGS. 4A to 4C, referring to FIG. 1E, the first signal via plug 71 and the first signal line 91 may be disposed between the first power rail 81 and the second power rail 82 (e.g., between a first inner power rail 81*a* and a second inner power rail 82*a*, between a first inner power rail 81*a* and a second power rail 82, or between a first power rail 81 and a second inner power rail 82*a*), the second upper signal via plug 72*a* and the second upper signal line 92*a* may be disposed in the first MOS region 11, and the second lower signal via plug 72*b* and the second lower signal line 92*b* may be disposed in the second MOS region 12. In an exemplary embodiment, the first signal via plug 71 and the second signal via plugs 72*a* and 72*b* may be interchanged, and the first signal line 91 and the second signal lines 92*a* and 92*b* may be interchanged. For example, the first upper signal via plug 71*a* and the first upper signal line 91*a* may be disposed in the first MOS region 11, and the second lower signal via plug 71*b* and the second lower signal line 91*b* may be disposed in the second MOS region 12.

Figure 5:
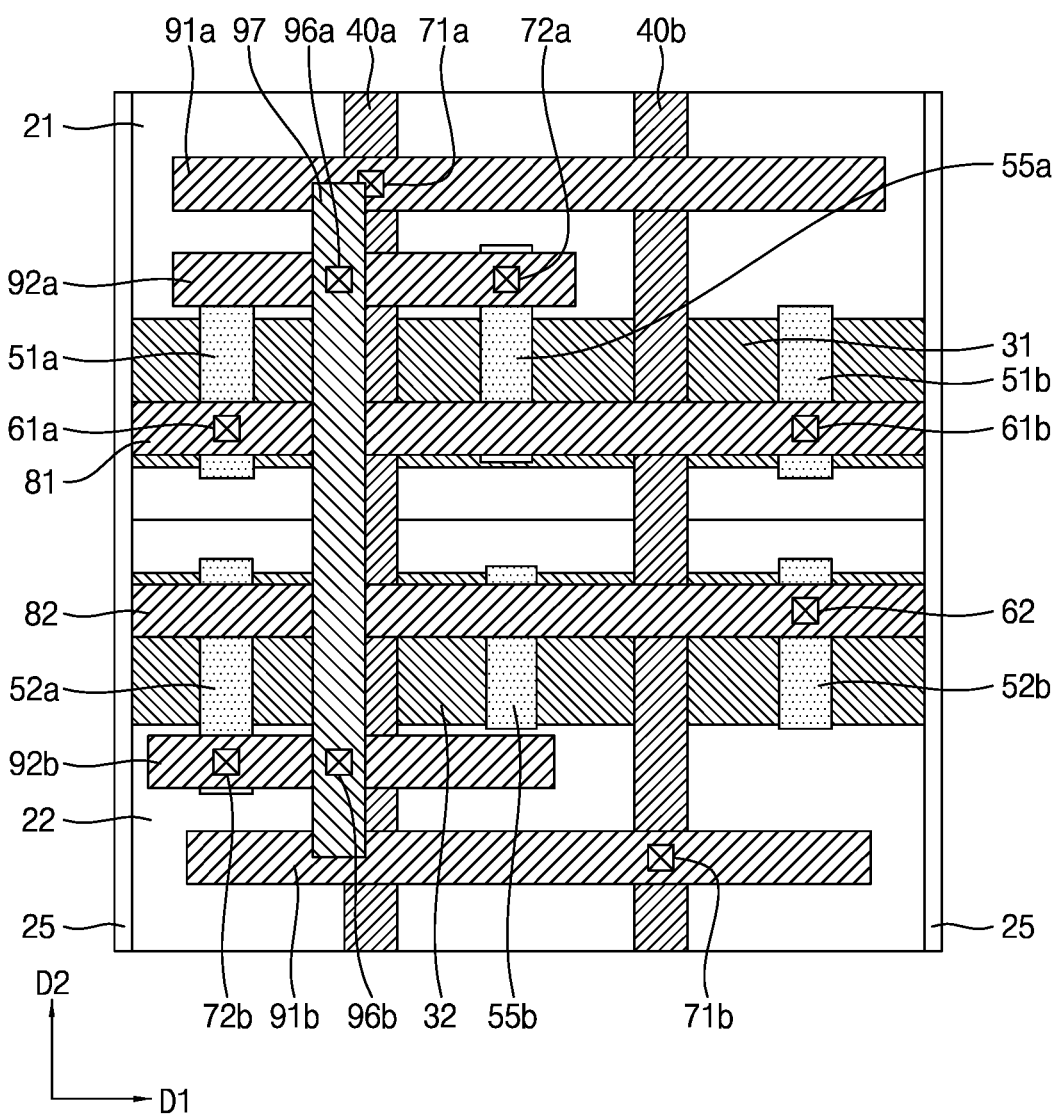
FIG. 5 is a layout of a standard cell 105 according to an exemplary embodiment of the present disclosure.

FIG. 5 is a layout of a standard cell 105 according to an exemplary embodiment of the present disclosure. Referring to FIG. 5, the standard cell 105 according to an exemplary embodiment of the present disclosure may include a plurality of common gate electrodes 40*a* and 40*b*, unlike the standard cells 101A to 101E, 102A to 102C, 103A to 103C and 104A to 104C illustrated in other drawings. For example, the standard cell 105 may include a plurality of first contact pads 51*a* and 51*b*, a plurality of second contact pads 52*a* and 52*b*, a plurality of common contact pads 55*a* and 55*b*, a plurality of first power via plugs 61*a* and 61*b*, a second power via plug 62, a plurality of first signal via plugs 71*a* and 71*b*, a plurality of second signal via plugs 72*a* and 72*b*, a plurality of first signal lines 91*a* and 91*b*, a plurality of second signal lines 92*a* and 92*b*, a first output via plug 96*a* and a second output via plug 96*b*, and an output line 97. The first output via plug 96*a* may connect the second upper signal line 92*a* to the output line 97. The second output via plug 96*b* may connect the second lower signal line 92*b* to the output line 97. The output line 97 may extend in the column direction. The output line 97 may be disposed on the second upper and lower signal lines 92*a* and 92*b*. The second upper signal via plug 72*a* may connect the common contact pad 55*a* to the second upper signal line 92*a*. The second lower signal via plug 72*b* may connect the second contact pad 52*a* to the second lower signal line 92*b*. Each of the plurality of common gate electrodes 40*a* and 40*b* may cross one of the first active region 31 and the second active region 32. The first active region 31 and the two common gate electrodes 40*a* and 40*b* may provide two PMOS transistors, and the second active region 32 and the two common gate electrodes 40*a* and 40*b* may provide two NMOS transistors. Source electrodes of the two PMOS transistors may be electrically connected to the first power rail 81 through the first contact pads 51*a* and 51*b* and the first power via plugs 61*a* and 61*b*, respectively. A source electrode of one of the two NMOS transistors may be electrically connected to the second power rail 82 through the second contact pad 52*b* and the second power via plug 62. The common gate electrodes 40*a* and 40*b* may be electrically connected to different respective first signal lines 91*a* and 91*b*. For example, the standard cell 105 of FIG. 5 may be a layout of a NAND circuit. In addition, when the first power rail 81 and the second power rail 82 are interchanged in function, the standard cell 105 may be a layout of a NOR circuit. In this case, the N-type and the P-type are also interchanged.

Figure 6A:
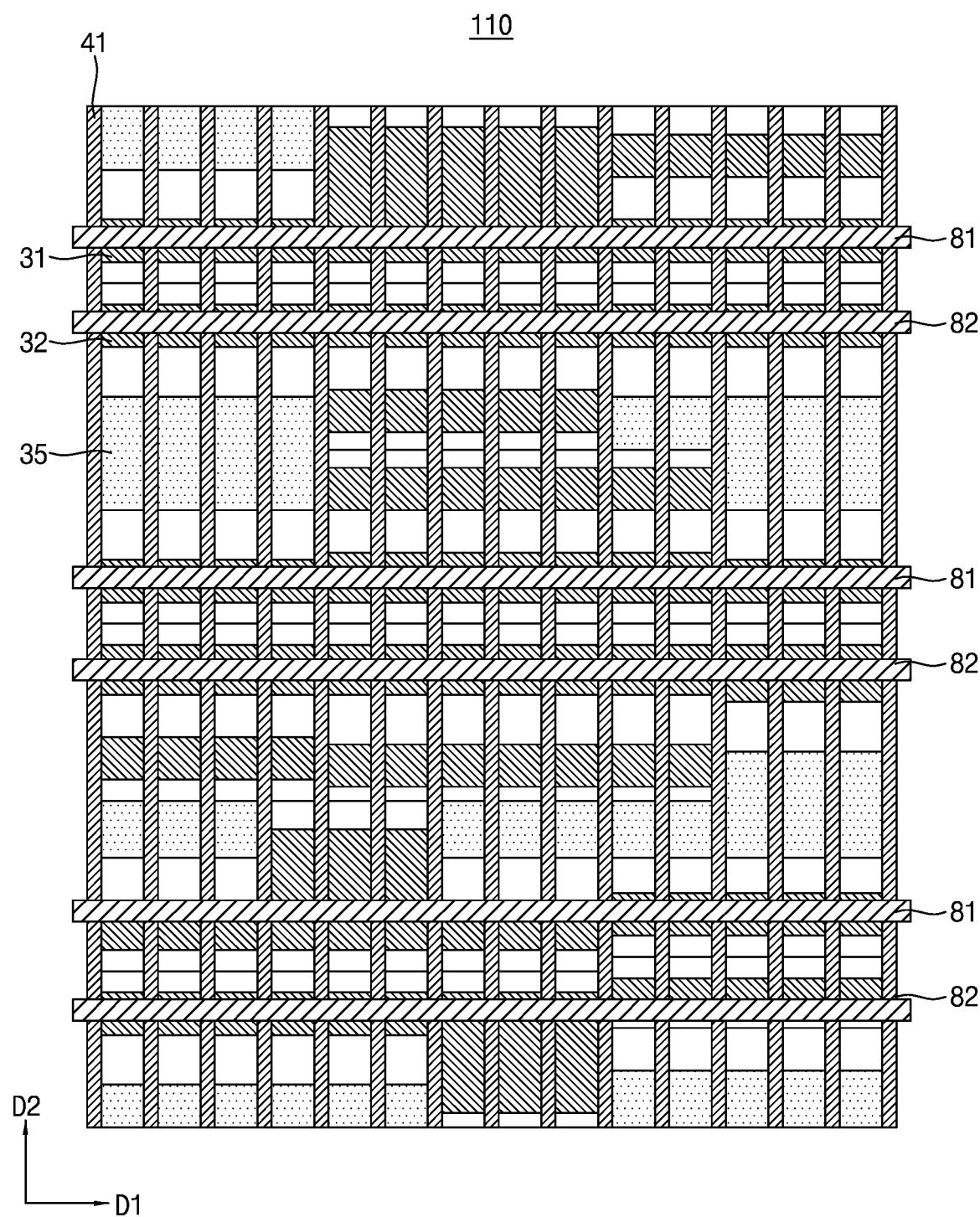
FIG. 6A is a layout illustrating a standard cell block 110 according to an exemplary embodiment of the present disclosure.
Figure 6B:
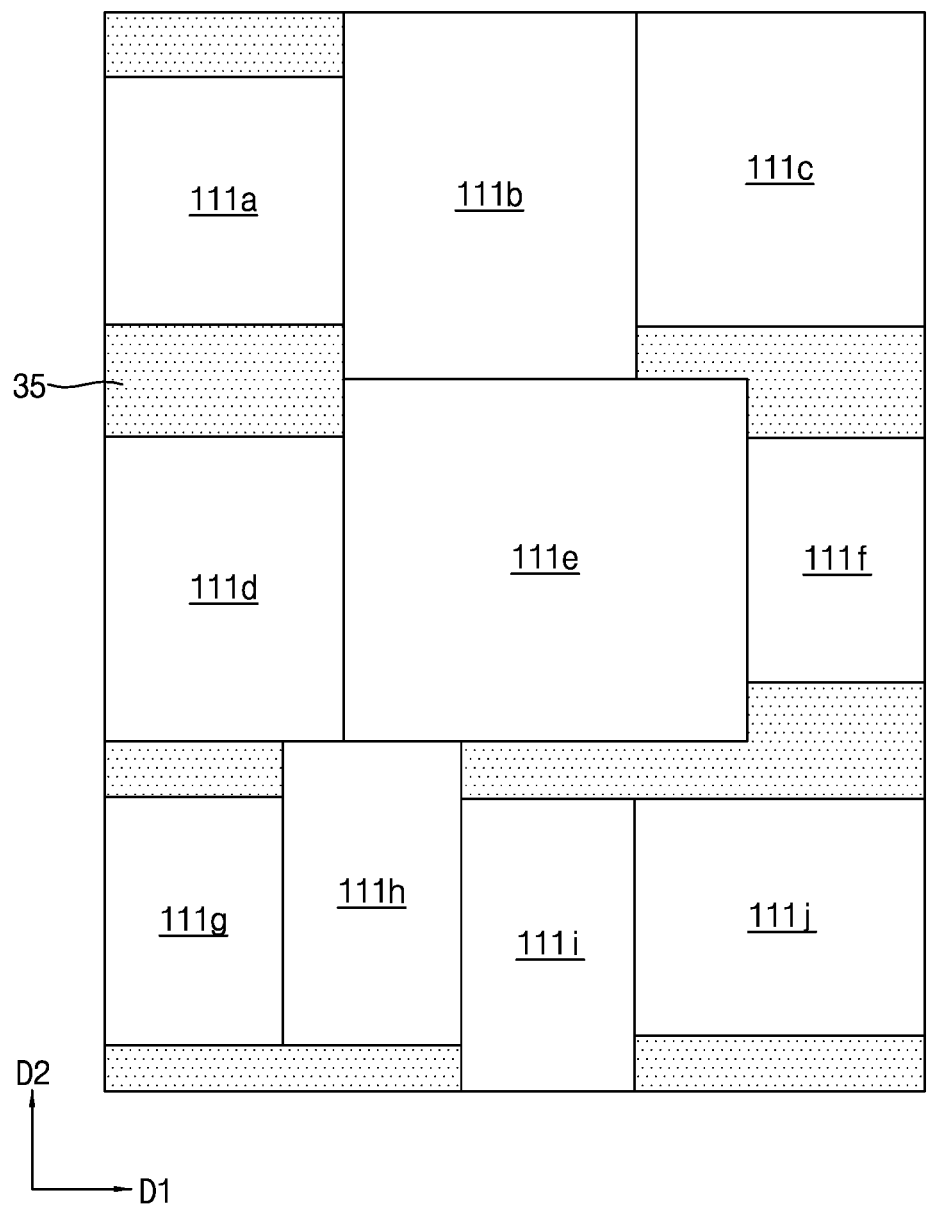
FIG. 6B is a block layout thereof.

FIG. 6A is a layout illustrating a standard cell block (or, a mixed standard cell) 110 according to an exemplary embodiment of the present disclosure, and FIG. 6B is a block layout thereof. Referring to FIGS. 6A and 6B, a standard cell block 110 according to an exemplary embodiment of the present disclosure may include a plurality of standard cells 111*a* to 111*j* disposed in a matrix form, and each of the standard cells 111*a* to 111*j* may have various heights or lengths in the second direction D2. Dummy cells 35 may be disposed between the standard cells 111*a* to 111*j*. Each of the dummy cells 35 may be one of a well region, an active region, and an isolation region. In example embodiments, the dummy cells 35 may be simultaneously formed with the standard cells 111*a* to 111*j* with the same processes. Each of the dummy cells 35 may not transmit and/or receive a signal to/from each of the standard cells 111*a* to 111*j*. The plurality of standard cells 111*a* to 111*j* may share power rails 81 and 82, respectively. In example embodiments, within the standard cell block 110, each power rail of the first power rails 81 and each power rail of the second power rails 82 may extend straight in the first direction D1. For example, each of the first power rail 81 and the second power rail 82 for the standard cells 111*a* to 111*c* may extend lengthwise in the first direction D1 and may have a uniform width in the second direction D2. For example, each of the first power rail 81 and the second power rail 82 for the standard cells 111*d* to 111*f* may extend lengthwise in the first direction D1 and may have a uniform width in the second direction D2. For example, each of the first power rail 81 and the second power rail 82 for the standard cells 111*g* to 111*j* may extend lengthwise in the first direction D1 and may have a uniform width in the second direction D2. Even though not shown, each of the first power rail 81 and the second power rail 82 for the standard cells 111*a* to 111*c* may have a first uniform width in the second direction D2, each of the first power rail 81 and the second power rail 82 for the standard cells 111*d* to 111*f* may have a second uniform width in the second direction D2, and each of the first power rail 81 and the second power rail 82 for the standard cells 111*g* to 111*j* may have a third uniform width in the second direction D2. In this case, each of the first through third uniform widths may be different from each other. Each of the standard cells 111*a* to 111*j* may include one of the various standard cells illustrated in FIGS. 1A to 1E, 2A to 2C, 3A to 3C, 4A to 4C, and 5, previously.

As is apparent from the above description, according to the exemplary embodiments of the disclosure, a standard cell may have various heights.

According to the exemplary embodiments of the disclosure, a standard cell may have active regions having various widths.

However, the effects achievable through the disclosure are not limited to the above-mentioned effects, and other effects not mentioned herein will be clearly understood by those skilled in the art from the above description.

While the embodiments of the disclosure have been described with reference to the accompanying drawings, it should be understood by those skilled in the art that various modifications may be made without departing from the scope of the disclosure as defined by the appended claims.

What is claimed is:

1. A standard cell block comprising:
a plurality of standard cells disposed in a matrix form and comprising a first standard cell and a second standard cell arranged in a first direction, the first and second standard cell having different cell heights along a second direction that is different from the first direction,
wherein each of the first and second standard cells comprises:
a first active region disposed in a first metal-oxide-semiconductor (MOS) region and extending in a first direction; and
a second active region disposed in a second MOS region and extending in the first direction,
wherein the standard cell block further comprises:
a first power rail extending in the first direction across the first MOS regions of the first standard cell and of the second standard cell, and
a second power rail extending in the first direction across the second MOS regions of the first standard cell and of the second standard cell,
wherein the first power rail is disposed closer to a boundary between the first MOS region and the second MOS region than to a first side of the first MOS region in each of the first standard cell and the second standard cell,
wherein the second power rail is disposed closer to the boundary between the first MOS region and the second MOS region than to a first side of the second MOS region in each of the first and second standard cells, and
wherein each of the first power rail and the second power rail has a uniform width in a second direction perpendicular to the first direction.

2. The standard cell block of claim 1, wherein for each of the first standard cell and the second standard cell, the first active region and the first power rail vertically overlap each other, and
wherein for each standard cell of the plurality of standard cells, the second active region and the second power rail vertically overlap each other.

3. The standard cell block of claim 1, further comprising, for each of the first standard cell and the second standard cell:
a gate electrode extending to cross the first active region and the second active region in a second direction,
wherein the gate electrode defines a first drain region and a first source region of the first active region and a second drain region and a second source region of the second active region.

4. The standard cell block of claim 3, further comprising, for each of the first standard cell and the second standard cell:
a first contact pad overlapping the first source region of the first active region;
a second contact pad overlapping the second source region of the second active region;
a common contact pad overlapping the first drain region of the first active region and the second drain region of the second active region;
a first power via plug electrically connecting the first contact pad to the first power rail; and
a second power via plug electrically connecting the second contact pad to the second power rail.

5. The standard cell block of claim 4, further comprising, for each of the first standard cell and the second standard cell:
a first signal line electrically connected to the gate electrode and disposed parallel to the first power rail; and
a second signal line electrically connected to the common contact pad and disposed parallel to the second power rail.

6. The standard cell block of claim 1, wherein the first active region of the first standard cell has a first width in the second direction that is different from a second width in the second direction of the first active region of the second standard cell.

7. The standard cell block of claim 1, wherein the second active region of the first standard cell has a first width in the second direction that is different from a second width in the second direction of the second active region of the second standard cell.

* * * * *